(12) United States Patent
Wiltzius et al.

(10) Patent No.: US 10,871,808 B2
(45) Date of Patent: Dec. 22, 2020

(54) EXPANSION CARD ASSEMBLY

(71) Applicant: HEWLETT-PACKARD DEVELOPMENT COMPANY, L.P., Spring, TX (US)

(72) Inventors: Andrew L. Wiltzius, Fort Collins, CO (US); Robert J. Ebner, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/341,051

(22) PCT Filed: Oct. 11, 2016

(86) PCT No.: PCT/US2016/056319
§ 371 (c)(1),
(2) Date: Apr. 10, 2019

(87) PCT Pub. No.: WO2018/070990
PCT Pub. Date: Apr. 19, 2018

(65) Prior Publication Data
US 2019/0227605 A1 Jul. 25, 2019

(51) Int. Cl.
*G06F 1/20* (2006.01)
*G06F 13/40* (2006.01)
*H05K 7/20* (2006.01)
*G06F 1/18* (2006.01)

(52) U.S. Cl.
CPC ............... *G06F 1/20* (2013.01); *G06F 1/185* (2013.01); *G06F 1/186* (2013.01); *G06F 13/409* (2013.01); *H05K 7/20145* (2013.01); *H05K 7/20172* (2013.01)

(58) Field of Classification Search
CPC . G06F 1/20; G06F 1/185; G06F 1/186; G06F 13/409; H05K 7/20145; H05K 7/20172
See application file for complete search history.

(56) References Cited

U.S. PATENT DOCUMENTS

| | | | |
|---|---|---|---|
| 7,075,797 B1* | 7/2006 | Leonard | G06F 1/184 361/785 |
| 7,843,685 B2 | 11/2010 | Beauchamp et al. | |
| 8,517,675 B2 | 8/2013 | Stanley et al. | |
| 8,885,336 B2 | 11/2014 | Kim et al. | |
| 9,575,520 B1* | 2/2017 | Chen | G06F 1/185 |
| 2003/0049948 A1* | 3/2003 | Kim | H05K 1/14 439/61 |
| 2004/0062013 A1 | 4/2004 | Kim et al. | |
| 2005/0061477 A1* | 3/2005 | Mira | F04D 29/582 165/80.3 |
| 2005/0128716 A1* | 6/2005 | Holt | H05K 7/1405 361/726 |

(Continued)

FOREIGN PATENT DOCUMENTS

DE 102007039639 B3 1/2009

*Primary Examiner* — Binh B Tran
*Assistant Examiner* — Michael A Matey
(74) *Attorney, Agent, or Firm* — Dierker & Kavanaugh PC

(57) ABSTRACT

In an example implementation, an expansion card assembly includes a low-profile expansion card, a card cooler attached to the card to force air over the card, and an airflow guide attachable to the card to direct forced air from the card cooler out of a full-height computer enclosure.

14 Claims, 3 Drawing Sheets

(56) References Cited

U.S. PATENT DOCUMENTS

| | | | |
|---|---|---|---|
| 2005/0213294 A1* | 9/2005 | Lambert | G06F 1/181 361/679.02 |
| 2006/0133059 A1* | 6/2006 | Dean | G06F 1/186 361/801 |
| 2006/0164808 A1* | 7/2006 | Stefanoski | G06F 1/20 361/700 |
| 2006/0238991 A1* | 10/2006 | Drako | G06F 1/185 361/796 |
| 2007/0047211 A1* | 3/2007 | Refai-Ahmed | H01L 23/4093 361/720 |
| 2007/0133178 A1* | 6/2007 | Han | G06F 1/20 361/719 |
| 2007/0280818 A1* | 12/2007 | Yang | F04D 29/161 415/102 |
| 2009/0002960 A1* | 1/2009 | Liu | G06F 1/185 361/759 |
| 2009/0040722 A1* | 2/2009 | Chu | F28D 15/0266 361/698 |
| 2009/0262497 A1 | 10/2009 | Beauchamp | |
| 2010/0049893 A1* | 2/2010 | Drako | G06F 13/409 710/301 |
| 2011/0235259 A1 | 9/2011 | Sun | |
| 2011/0279969 A1* | 11/2011 | Memon | G06F 1/20 361/679.47 |
| 2011/0299239 A1 | 12/2011 | Santos | |
| 2012/0232849 A1* | 9/2012 | Kosugi | G06F 30/17 703/1 |
| 2014/0106604 A1 | 4/2014 | Chen et al. | |
| 2014/0340834 A1* | 11/2014 | Lee | G06F 1/185 361/679.32 |
| 2016/0216746 A1* | 7/2016 | Oliver | G06F 1/186 |
| 2016/0282065 A1 | 9/2016 | Mitsui | |
| 2017/0115704 A1* | 4/2017 | Ent | G06F 1/186 |

* cited by examiner

EXPANSION CARD ASSEMBLY

BACKGROUND

There are many types of expansion cards that can be added to most computers to enhance the capabilities of the computers. For example, computers used for gaming often include an added video/graphics card that improves the video performance of the computer. Expansion cards can be fit into expansion slots or openings in most computer enclosures, and in some examples multiple expansion cards can be packed together in close proximity to one another within the enclosures. Expansion cards generally comprise a printed circuit board (PCB) with a number of electronic components mounted to the board. During operation, the electronic components mounted to the board can generate a large amount of heat. To help ensure reliable operation of the electronic components on the expansion cards, heat generated by the cards can be transferred away from the cards.

BRIEF DESCRIPTION OF THE DRAWINGS

Examples will now be described with reference to the accompanying drawings, in which.

Throughout the drawings, identical reference numbers designate similar, but not necessarily identical, elements.

DETAILED DESCRIPTION

Figure 1:
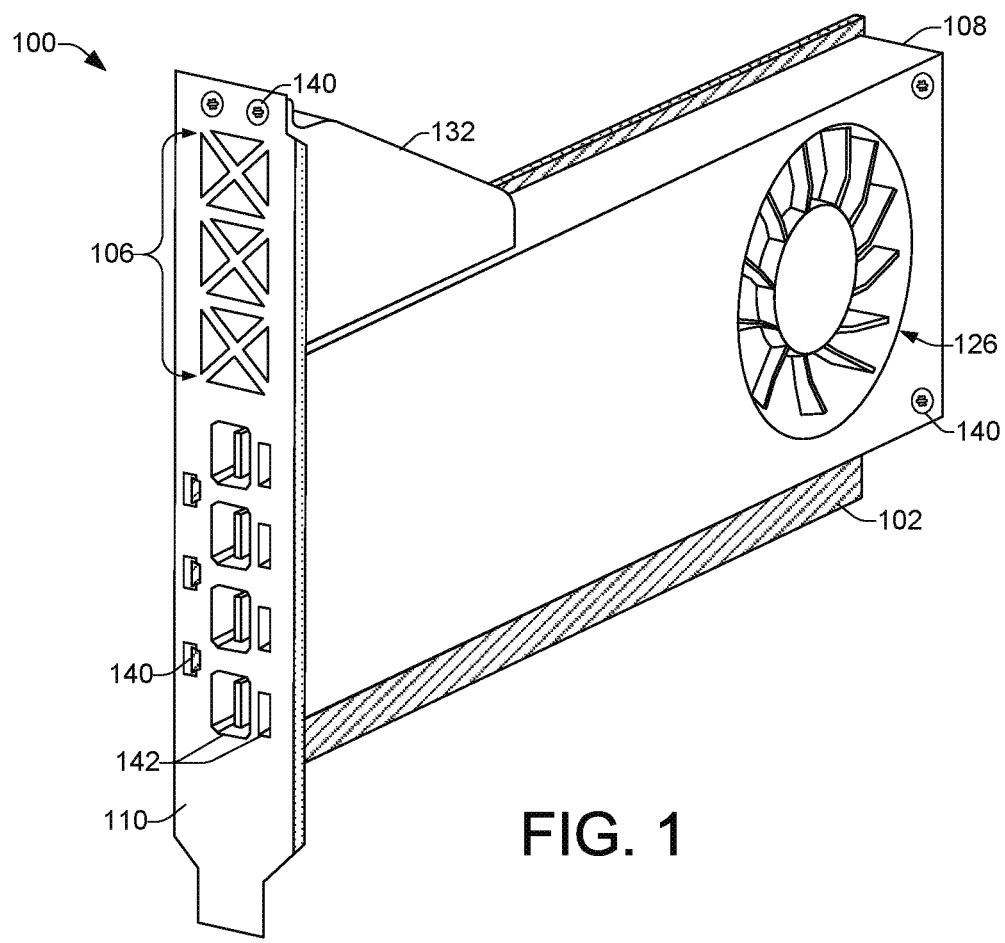
FIG. 1 shows a perspective view of an example expansion card assembly with a low-profile expansion card that is suitable for installation into a full-height computer enclosure.

Computer enclosures (also referred to as chassis, or cases) come in various sizes including full-height enclosures and low-profile enclosures (sometimes referred to as small form factor enclosures). Both full-height and low-profile computer enclosures can include expansion openings that enable upgrading the computer with additional components. Expansion openings are often found on the back side of a computer enclosure, and when they're not being used they can be closed off with a blank covering such as a thin piece of metal that can help prevent the entry of dust or other particles into the enclosure, improve air flow within the enclosure, and prevent electrical interference.

A variety of expansion cards can be installed in a computer, including sound cards, network cards, modem cards, interface cards, video cards (also referred to as graphics cards), and others. Expansion cards generally extend the features of a computer's motherboard and/or provide additional features not available on the motherboard. An expansion card can be installed in a computer by inserting the card into an expansion card slot located on the motherboard, such as a PCI (peripheral component interconnect) slot, an AGP (accelerated graphics port), or a PCI Express slot. An expansion card can include an I/O (input/output) bracket at one end that allows the card to be attached to the computer enclosure at one of the expansion openings. The I/O bracket (alternately referred to as a mounting bracket) also includes appropriately formed openings to accommodate various I/O ports on the expansion card, such as plugs, connectors, and sockets, and to provide access to these I/O ports from outside the computer enclosure.

The number of expansion cards that can be added to a computer system can depend in part on the size of the computer enclosure and the form factor of the computer motherboard. For example, full-height computer enclosures often have more expansion openings than low-profile enclosures, due to the additional space available in the full-height enclosures. The size of the computer enclosure can also affect the circulation of air inside the enclosure, which in turn, can impact the ability to keep the computer components cool. As the number of expansion cards increases, the power they consume and the heat they generate can become limiting factors.

Expansion cards generally incorporate numerous integrated circuits and other electronic components that generate heat within the computer enclosure during operation. Video cards, for example, comprise graphical processing units (GPU) and associated electronic components that can consume significant energy and create large amounts of heat when carrying out complex calculations and generating images to be output on a display device. Because of the excess heat that video cards produce, they often include integrated cooling solutions that help prevent the integrated circuits and other components on the cards from exceeding their operating temperature limits. Examples of such cooling solutions include passive, open-air cooling solutions such as heat sinks, and active, forced-air cooling solutions such as fans or other types of blowers that can move air over the video card.

Cooling solutions on video cards can remove heat by actively forcing air over the cards and expelling the heated air from the computer enclosure, for example, through vents in the enclosure. In some examples, however, if there is inadequate venting throughout the computer enclosure, or, if the venting is located in areas of the enclosure that do not allow heated air to exit the enclosure sufficiently, then the heated air can recirculate within the computer enclosure and cause unwanted temperature increases in components throughout the enclosure. This issue is often encountered in circumstances where low-profile video cards are installed into full-height computer enclosures, as discussed in more detail below.

In some examples, low-profile video cards that are designed for use in low-profile computer enclosures, can also be used in full-height computer enclosures. Full-height computer enclosures are generally designed to accept full-height expansion cards on the order of 4.38 inches in height, while low-profile computer enclosures are designed to accept low-profile expansion cards on the order of 2.73 inches in height. Manufacturers can enable the versatile use of a low-profile video card in both low-profile and full-height computer enclosures, for example, by providing two differently sized I/O brackets with which to attach the low-profile card to the two differently sized computer enclosures. By enabling the use of a low-profile video card in both full-height and low-profile computer enclosures, manufacturing costs can be reduced and product selection choices can be simplified for consumers making upgrades to their computer systems. For example, in a first or default configuration, a computer system housed within a low-profile computer enclosure can include a low-profile video card installed within the low-profile enclosure using a smaller I/O bracket, while in a second configuration, a computer system housed within a full-height computer enclosure can include the low-profile video card installed within the full-height enclosure using a larger I/O bracket.

As indicated above, when low-profile video cards are installed in full-height computer enclosures, managing the temperature within the enclosure can be a challenging issue. If heated air from the video card cooling solution cannot be adequately expelled from the enclosure, it mixes with the ambient air inside the enclosure and raises the overall temperature inside the enclosure. When full-height video cards are installed in full-height computer enclosures, the full-height I/O brackets often include vent holes that allow the heated air from the card cooler to be expelled directly out the rear of the enclosure. However, when low-profile video cards are installed in full-height computer enclosures, the vent holes in the full-height I/O bracket are of marginal value because they are located on the bracket above the plane of the video card, and they are not aligned with the heated airflow stream coming from the card cooler. The result in most examples, therefore, is that the heated air from the video card cooler gets recirculated within the computer enclosure instead of being expelled from the enclosure.

Accordingly, examples of an expansion card assembly described herein provide a device and method for guiding heated air away from a low-profile expansion card and expelling the heated air from a full-height computer enclosure in which the low-profile card is installed. The expansion card assembly includes a low-profile card cooler attached to the low-profile expansion card, and a full-height I/O bracket (i.e., mounting bracket) to mount the card and the card cooler to the full-height computer enclosure. The device for guiding the heated air comprises a removable airflow guide that is attachable to the low-profile expansion card as part of the assembly when the assembly is to be installed in a full-height computer enclosure. The airflow guide directs heated air forced by the card cooler over the low-profile expansion card out of the full-height computer enclosure through vent holes formed in the full-height I/O bracket. The airflow guide is removable from the low-profile expansion card assembly when the assembly is to be installed in a low-profile computer enclosure.

When the airflow guide is attached to the expansion card assembly, an opening on one side of the airflow guide serves as an air intake positioned adjacent to an exhaust region of the card cooler to allow heated air from the card cooler to enter the airflow guide. A passageway in the airflow guide directs the heated air out of an air output opening on a second side of the airflow guide. The air output of the airflow guide is positioned adjacent to vent holes formed in a full-height I/O bracket. The vent holes in the I/O bracket allow the heated air flowing through the airflow guide to be expelled directly from the full-height computer enclosure into the atmosphere surrounding the outside of the enclosure.

In one example, an expansion card assembly includes a low-profile expansion card and a card cooler attached to the card to force air over the card. The assembly also includes an airflow guide attachable to the card to direct forced air from the card cooler out of a full-height computer enclosure in which the card can be installed.

In another example, a method of removing heat from a low-profile expansion card assembly includes securing a low-profile expansion card to a full-height mounting bracket, where the card comprises an attached card cooler. The method includes securing the bracket to a full-height computer enclosure, where the bracket is to support the card and card cooler within the full-height computer enclosure. The method also includes attaching an airflow guide to the bracket and the card to enable forced air from the card cooler to exit the full-height computer enclosure through the bracket.

In another example, an expansion card assembly includes a full-height mounting bracket comprising a plurality of I/O connection ports toward a first end, and vent openings toward a second end opposite the first end. The assembly also includes a low-profile video card attached to the bracket and comprising a plurality of output connectors aligned with the plurality of I/O connection ports on the bracket. An airflow guide can be attached to the low-profile video card and to the bracket toward the second end of the bracket such that an output opening of the airflow guide aligns with the vent openings.

Figure 3:
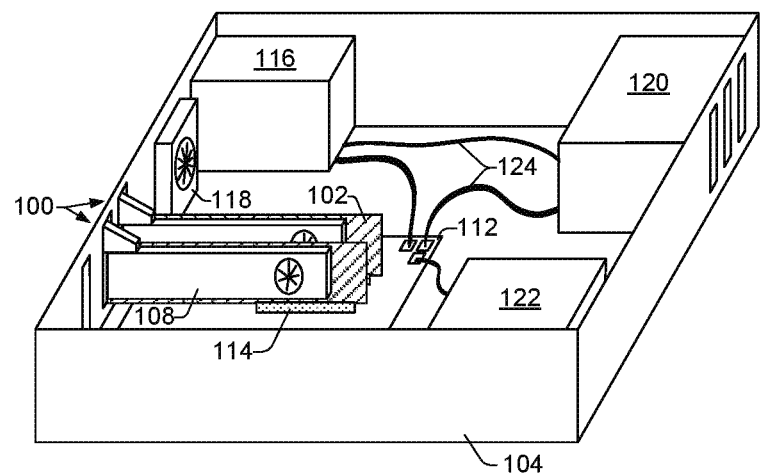
FIG. 3 shows a perspective block diagram view of an example of a full-height computer closure into which an example expansion card assembly can be installed.
Figure 2:
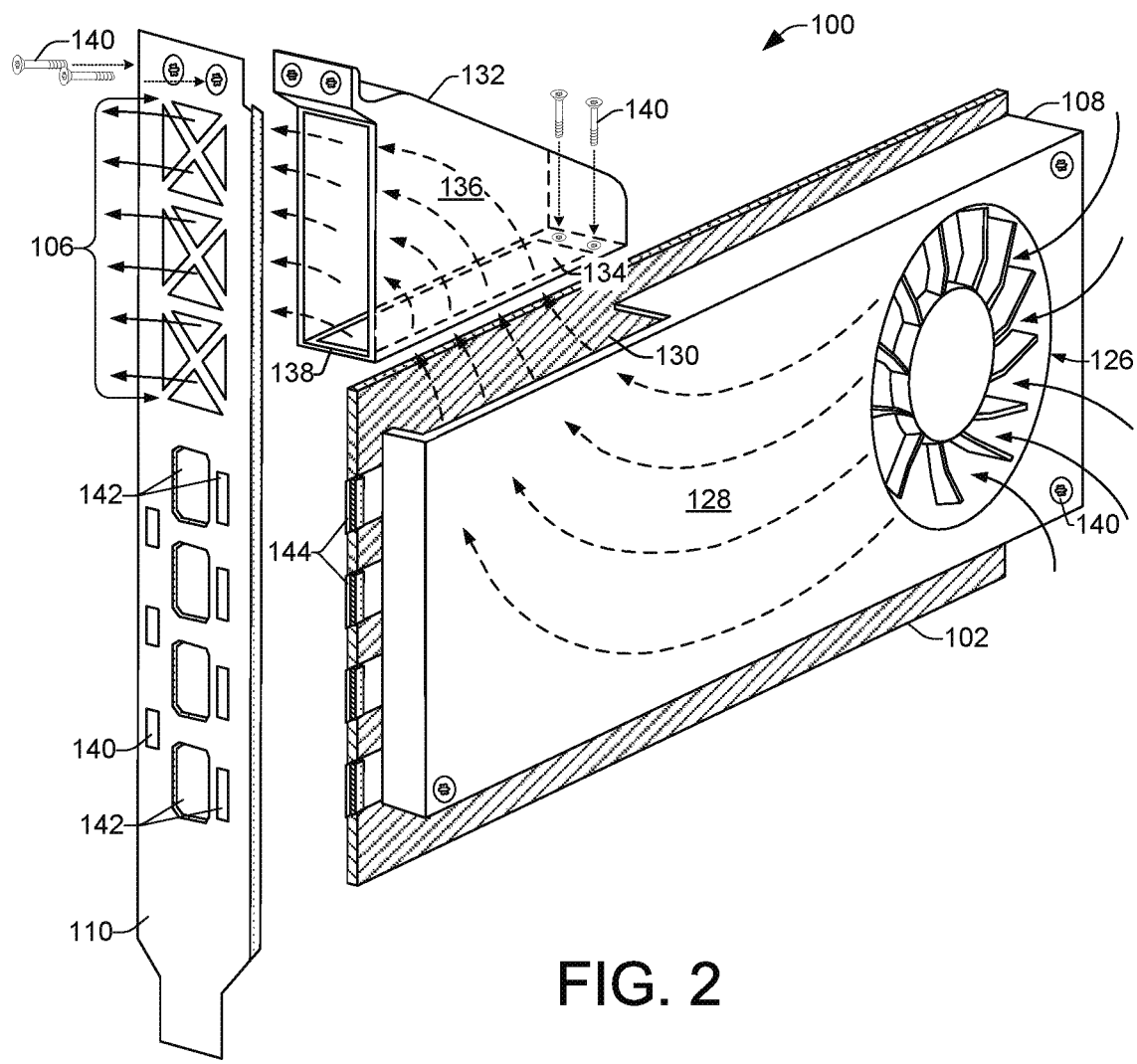
FIG. 2 shows a perspective view of the example expansion card assembly as in FIG. 1 with some components of the assembly blown up and separated from one another to illustrate the flow of air through the assembly.

FIG. 1 shows a perspective view of an example expansion card assembly 100 with a low-profile expansion card 102 that is suitable for installation into a full-height computer enclosure 104 (shown in FIG. 3). FIG. 2 shows a perspective view of the example expansion card assembly 100 of FIG. 1 with some components of the assembly 100 blown up, or separated from one another, to help illustrate the flow of air through the assembly, as discussed in more detail below. FIG. 3 shows a perspective block diagram view of an example of a full-height computer closure 104 into which an example expansion card assembly 100 can be installed.

Referring generally to FIGS. 1-3, an example expansion card assembly 100 can remove heat from a low-profile expansion card 102 by forcing air over the card 102 and guiding the heated air toward vent openings 106, where it is expelled from the full-height computer enclosure 104. The expansion card assembly 100 includes the low-profile expansion card 102 attached to a low-profile card cooler 108. The assembly 100 also includes a full-height I/O bracket 110 (i.e., mounting bracket 110) to which the low-profile expansion card 102 can be attached and then mounted to the full-height computer enclosure 104.

The low-profile expansion card 102 can include any of a variety of different types of expansion cards capable of installation into a computer including, for example, a sound card, a video card, a modem card, a network card, an interface card, and so on. As discussed herein, however, the low-profile expansion card 102 will be generally referred to as a low-profile video card 102. This is because video cards tend to generate more heat than other types of expansion cards, and they are therefore more likely than other types of expansion cards to incorporate an attached card cooler 108.

In some examples, as shown in FIG. 3, multiple expansion cards can be installed in slots on a motherboard within a computer enclosure. In FIG. 3, multiple low-profile video cards 102, each with an attached card cooler 108 are installed on the motherboard 112 within the full-height computer enclosure 104. When multiple video cards are installed in a computer enclosure, the higher density of electronic components within the enclosure can make it particularly challenging to maintain a proper temperature throughout the enclosure and avoid causing the electronic components on the cards, motherboard, and other devices within the enclosure to exceed their operating temperature limits.

Referring still to FIG. 3, in some examples, a low-profile video card 102 can be installed into a PCI (peripheral component interconnect) slot 114 on the motherboard 112. However, in some examples, the low-profile video card 102 might additionally or alternatively fit into other types of slots, such as AGP (accelerated graphics port) slots, or PCI Express slots. In addition to a motherboard 112 with installed expansion cards, other components often connected within the computer enclosure 104 include a power supply 116, an auxiliary exhaust fan 118 to help remove heat from the enclosure, drives 120 for CDs and DVDS, hard drives 122, and interconnect and power cables 124.

Referring generally to FIGS. 1-3, the card cooler 108 attached to the low-profile video card 102 comprises a card cooling device that can include, for example, an active, forced-air cooling device capable of moving air over the video card 102. In some examples, as shown in FIGS. 1 and 2, an active forced-air cooling device comprises a fan 126 that can pull air into a chamber 128 of the card cooler 108. The chamber 128 covers one side of the low-profile video card 102 (i.e., the component side) on which a majority of the electronic components (not shown) are located.

Referring more specifically now to FIG. 2, arrows are shown using both dashed lines and full lines to help illustrate the flow of air through the expansion card assembly 100. Arrows with dashed lines shown in FIG. 2 generally indicate the flow of air as it passes within or through components of the expansion card assembly 100, while arrows with full lines (i.e., non-dashed lines) generally indicate the flow of air outside of the assembly 100. Thus, as indicated by the arrows with full lines, air enters the assembly 100 through the fan 126 when the fan 126 is active. As indicated by the arrows with dashed lines, air that has entered the assembly 100 through the fan 126 travels through the chamber 128 and over the component side of the low-profile video card 102. The heated air is then forced out of an exhaust region 130 of the card cooler 108.

The expansion card assembly 100 includes a removable airflow guide 132 that can be attached to any or all of the card cooler 108, the low-profile video card 102, and the full-height I/O mounting bracket 110. The size and shape of the airflow guide 132 are generally designed to facilitate the alignment of airflow openings between the card cooler 108, the airflow guide 132, and the full-height I/O bracket 110. For example, as shown in FIG. 2, the depth or length of the airflow guide 132 is long enough to encompass the length of the exhaust region 130 of the card cooler 108, but in some examples it may be longer or shorter than the exhaust region. The width of the airflow guide 132, similarly, is approximately as wide as the card cooler 108 to enable the width of the airflow guide 132 to cover the width of the exhaust region 130. Thus, when the airflow guide 132 is attached, the exhaust region 130 of the card cooler 108 aligns with an air intake 134 on the airflow guide 132. This alignment allows the heated air being forced out of the exhaust region 130 of the card cooler 108 to enter the removable airflow guide 132 through the air intake 134. The height of the airflow guide 132 extending above the card cooler 108 is sufficient to enable the air output opening 138 of the airflow guide 132 to encompass the multiple vents 106 formed in the full-height I/O bracket 110. In some examples, the height may be greater or lower depending, for example, where the vents 106 are located in the bracket 110. In general, the height of the airflow guide 132 facilitates the passing of heated air through the air output opening 138 and out through the vents 106 formed in the full-height I/O bracket 110, and ultimately out of the full-height computer enclosure 104. The shape of the airflow guide 132 facilitates the flow of air through the guide 132 between its intake 134 and output 138 along a passageway 136. Thus, while the shape illustrated in FIGS. 1 and 2 is generally triangular, other shapes and contours are possible and contemplated to enable the passageway 136 in the airflow guide 132 to direct the heated air away from the low-profile video card 102 and through the air output opening 138 of the airflow guide 132.

The full-height I/O bracket 110 comprises a full-height mounting bracket that is designed to accommodate physical and functional connections between, and to, the low-profile video card 102, the card cooler 108, the removable airflow guide 132, and the full-height computer enclosure 104. A variety of different connection mechanisms 140 can be used for connecting the components of the expansion card assembly 100 to one another and to the computer enclosure 104, including, for example, screws, tab connectors, crimp connectors, snap connectors, and so on. The I/O bracket 110 can include multiple I/O connection ports 142 positioned toward one end of the bracket to enable cable connections to be made between the low-profile video card 102 and multiple display devices. The connection ports 142 align with output connectors 144 along one end of the low-profile video card 102. In different examples, the connection ports 142 can comprise any of a variety of different types of connection ports such as HDMI, VGA, S-video, composite video, DVI, SDI, and so on.

In addition to the I/O connection ports 142, the full-height I/O bracket 110 includes one or multiple vent openings 106 to allow heated air to be expelled from the full-height computer enclosure 104. The vent openings 106 are not aligned with the low-profile video card 102 or the card cooler 108, but instead are positioned toward a second end of the bracket above the plane of the edge of the video card 102. The positioning of the vent openings 106 in the full-height I/O bracket 110 causes the vents 106 to be aligned with the air output opening 138 of the removable airflow guide 132 when the bracket 110 and airflow guide 132 are connected. Expelling heated air from the full-height computer enclosure 104 prevents heated air from being recirculated within the enclosure and repeatedly pulled back over the low-profile video card 102 by the card cooler 108. This process helps to avoid temperature increases within the enclosure that can lead to overheating of electronic components on the video card 102, the motherboard, the power supply, and other devices, that in turn can lead to improper functioning and/or damage to these components and devices.

Figure 4:
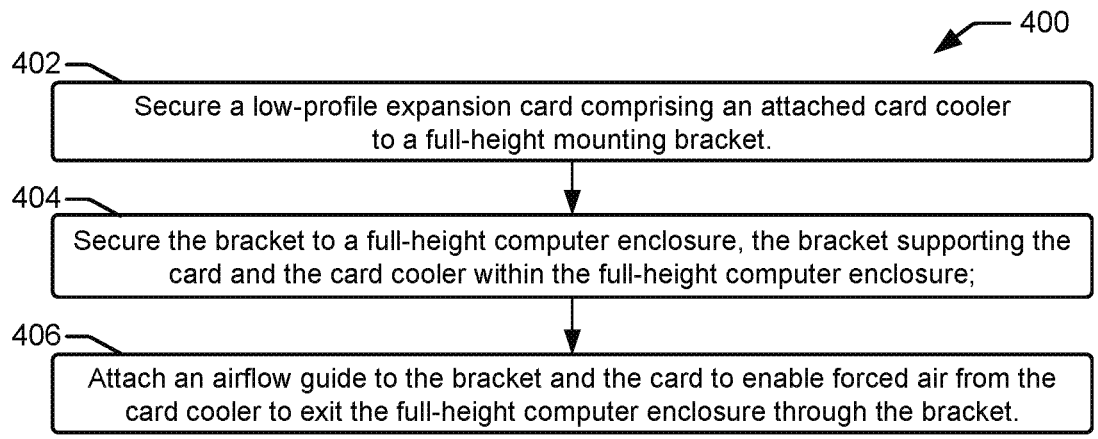
FIGS. 4 and 5 show flow diagrams illustrating example methods of removing heat from an expansion card assembly.
Figure 5:
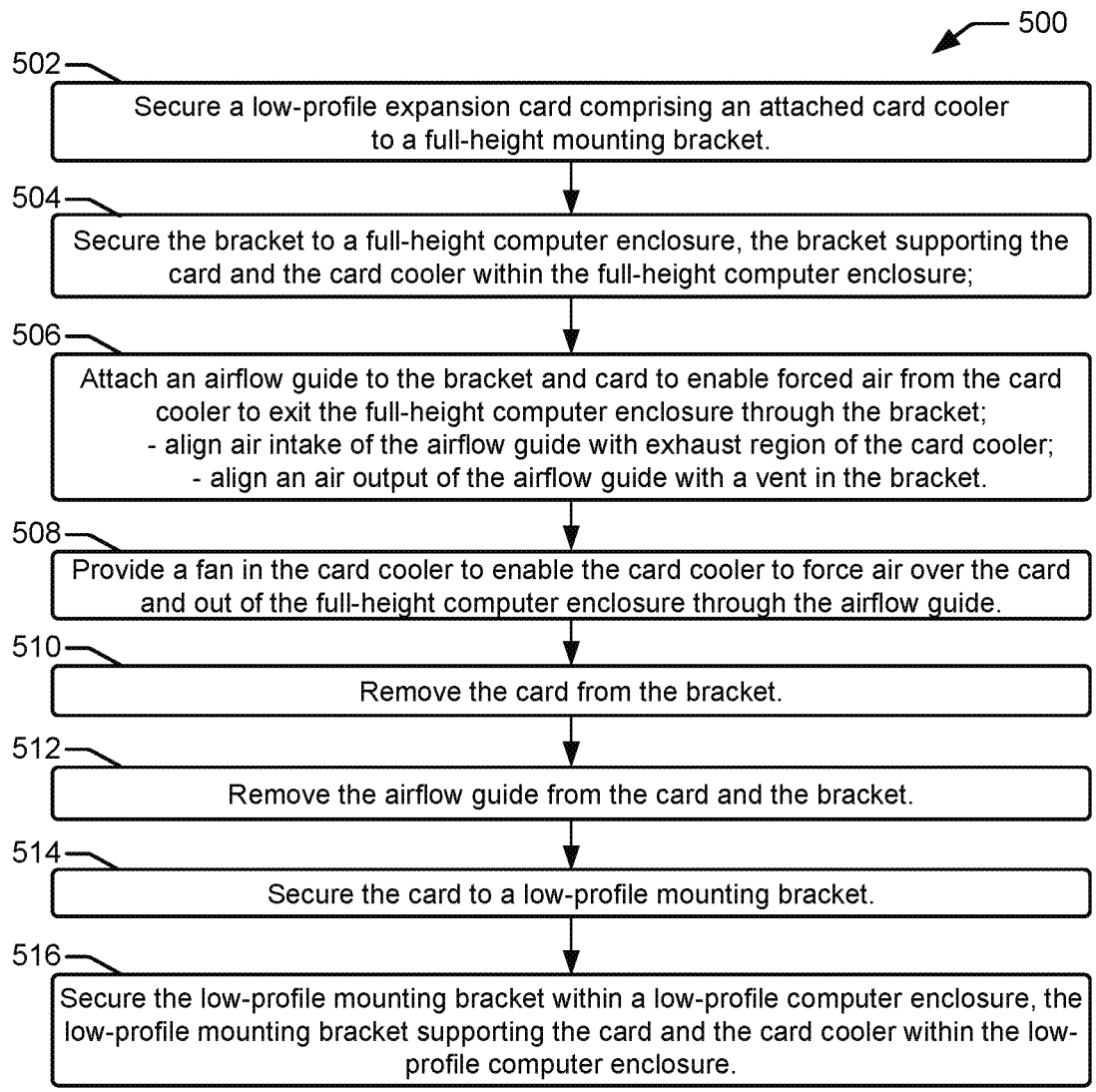

FIGS. 4 and 5 show flow diagrams illustrating example methods 400 and 500, respectively, of removing heat from an expansion card assembly. Method 500 is an extension of method 400 that incorporates additional details. Methods 400 and 500 are associated with the examples discussed herein with regard to FIGS. 1-3, and details of the operations shown in these methods can be found in the related discussion of such examples. In some examples, methods 400 and 500 may include more than one implementation, and different implementations of methods 400 and 500 may not employ every operation presented in the respective flow diagrams of FIGS. 4 and 5. Therefore, while the operations of methods 400 and 500 are presented in a particular order within the flow diagrams, the order of their presentation is not intended to be a limitation as to the order in which the operations may actually be implemented, or as to whether all of the operations may be implemented. For example, one implementation of method 500 might be achieved through the performance of a number of initial operations, without performing one or more subsequent operations, while another implementation of method 500 might be achieved through the performance of all of the operations.

Referring now to the flow diagram of FIG. 4, an example method 400 of removing heat from an expansion card assembly can include securing a low-profile expansion card to a full-height mounting bracket, as shown at block 402. The low-profile expansion card comprises an attached card cooler. As shown at block 404, the method can include securing the bracket to a full-height computer enclosure. The bracket can support the card and the card cooler within the full-height computer enclosure. The method can also include attaching an airflow guide to the bracket and the card to enable forced air from the card cooler to exit the full-height computer enclosure through the bracket, as shown at block 406.

Referring now to the flow diagram of FIG. 5, another example method 500 of removing heat from an expansion card assembly is shown. As noted above, method 500 is an extension of method 400 that incorporates additional details. Accordingly, like method 400, method 500 can include securing a low-profile expansion card to a full-height mounting bracket, and securing the bracket to a full-height computer enclosure, as shown at blocks 502 and 504, respectively. As shown at block 506, the method 500 can include attaching an airflow guide to the bracket and the card to enable forced air from the card cooler to exit the full-height computer enclosure through the bracket. In some examples, attaching the airflow guide can include aligning an air intake of the airflow guide with an exhaust region of the card cooler, and aligning an air output of the airflow guide with a vent in the bracket. As shown at block 508, the method 500 can include providing a fan in the card cooler to enable the card cooler to force air over the card and out of the full-height computer enclosure through the airflow guide.

In some examples, the method 500 of removing heat from an expansion card assembly can include removing the card from the full-height mounting bracket it was previously attached to, and removing the airflow guide from the card and the bracket, as shown at blocks 510 and 512, respectively. As shown at block 514, the low-profile expansion card can then be secured to a low-profile mounting bracket, and the low-profile mounting bracket can be secured within a low-profile computer enclosure, as shown at block 516. The low-profile mounting bracket can support the low-profile expansion card and the card cooler within the low-profile computer enclosure.

What is claimed is:

1. An expansion card assembly comprising:
   a low-profile expansion card;
   a card cooler attached to the card to force air over the card and out of a single exhaust region of the card cooler; and,
   an airflow guide attachable to the card cooler to receive forced air from the single exhaust region of the card cooler, pass the forced air through a passageway of the airflow guide from an air intake to an air output, and direct the forced air out of a full-height computer enclosure.

2. An assembly as in claim 1, further comprising:
   a full-height bracket attached to the low-profile expansion card to secure the low-profile expansion card to the full-height computer enclosure, wherein the bracket comprises a vent to enable the forced air to pass from the airflow guide out of the full-height computer enclosure through the bracket.

3. An assembly as in claim 2, wherein the airflow guide comprises a removable airflow guide, and wherein upon attachment of the removable airflow guide to the card cooler, the air intake of the removable airflow guide is located adjacent to the single exhaust region of the card cooler and the air output of the removable airflow guide is located adjacent to the vent in the bracket.

4. An assembly as in claim 1, wherein the airflow guide comprises a removable airflow guide, and where upon removal of the removable airflow guide from the card cooler, the assembly is insertable into a low-profile computer enclosure.

5. An assembly as in claim 1, wherein the low-profile expansion card is selected from the group consisting of a video card, a network card, a memory card, a modem card, and an interconnect card.

6. An assembly as in claim 1, wherein the card cooler comprises a fan to force air over the card and out of the computer enclosure through the airflow guide.

7. An assembly as in claim 2, wherein the full-height bracket comprises I/O (input/output) port openings to accommodate I/O ports of the low-profile expansion card.

8. A method of removing heat from an expansion card assembly comprising:
   securing a low-profile expansion card to a full-height mounting bracket, the card comprising an attached card cooler with a single exhaust region;
   securing the bracket to a full-height computer enclosure, the bracket supporting the card and the card cooler within the full-height computer enclosure; and,
   attaching an airflow guide to the bracket and the card to enable forced air to pass from the single exhaust region of the card cooler into an air intake of the airflow guide, through a passageway of the airflow guide, and out of an air output of the airflow guide to exit the full-height computer enclosure through the bracket.

9. A method as in claim 8, wherein attaching an airflow guide comprises:
   aligning the air intake of the airflow guide with the single exhaust region of the card cooler; and
   aligning the air output of the airflow guide with a vent formed in the bracket.

10. A method as in claim 8, further comprising providing a fan in the card cooler to enable the card cooler to force air over the card and out of the full-height computer enclosure through the airflow guide.

11. A method as in claim 8, further comprising:
    removing the card from the bracket;
    removing the airflow guide from the card and the bracket;
    securing the card to a low-profile mounting bracket; and,
    securing the low-profile mounting bracket within a low-profile computer enclosure, the low-profile mounting bracket supporting the card and the card cooler within the low-profile computer enclosure.

12. An expansion card assembly comprising:
    a full-height mounting bracket comprising a plurality of I/O connection ports toward a first end, and vent openings toward a second end opposite the first end;
    a low-profile video card attached to the bracket and comprising a plurality of output connectors aligned with the plurality of I/O connection ports on the bracket;
    a card cooler having a single exhaust region attached to the low-profile video card;
    an airflow guide attached to the low-profile video card and to the bracket toward the second end such that an output opening of the airflow guide aligns with the vent openings and the single exhaust region of the card cooler aligns with an air intake of the airflow guide.

13. An expansion card assembly as in claim 12, wherein the card cooler comprises a fan to force air over a component surface of the low-profile video card and through the airflow guide such that the forced air exits the full-height computer enclosure through the vent openings in the bracket.

14. An expansion card assembly as in claim 12, wherein the airflow guide comprises a removable airflow guide to enable installation of the expansion card assembly into a low-profile computer enclosure when the removable airflow guide is removed from the expansion card assembly.

\* \* \* \* \*